US009648785B2

(12) United States Patent
Nguyen et al.

(10) Patent No.: US 9,648,785 B2
(45) Date of Patent: May 9, 2017

(54) COMPUTING RACK AIRFLOW DIRECTING SYSTEM AND METHOD

(71) Applicant: Level 3 Communications, LLC, Broomfield, CO (US)

(72) Inventors: Joseph Nguyen, Denver, CO (US); Joel S. Skoglund, Brighton, CO (US)

(73) Assignee: Level 3 Communications, LLC, Broomfield, CO (US)

( * ) Notice: Subject to any disclaimer, the term of this patent is extended or adjusted under 35 U.S.C. 154(b) by 553 days.

(21) Appl. No.: 14/336,982

(22) Filed: Jul. 21, 2014

(65) Prior Publication Data

US 2016/0021790 A1    Jan. 21, 2016

(51) Int. Cl.
*H05K 7/20* (2006.01)
*H05K 5/02* (2006.01)
*H05K 5/03* (2006.01)
*F24F 7/007* (2006.01)

(52) U.S. Cl.
CPC ....... *H05K 7/20736* (2013.01); *H05K 5/0213* (2013.01); *F24F 7/007* (2013.01); *H05K 7/20554* (2013.01)

(58) Field of Classification Search
CPC ........... H05K 7/20736; H05K 7/20554; H05K 7/20718; H05K 5/0213; F24F 7/007
USPC .......... 454/184, 234, 307, 188–193
IPC ........ H05K 7/20,2/03, 5/03
See application file for complete search history.

(56) References Cited

U.S. PATENT DOCUMENTS

| | | | |
|---|---|---|---|
| 8,713,869 B1 | 5/2014 | Eychaner et al. | |
| 9,016,352 B2 * | 4/2015 | Helbig | F28F 9/007 165/67 |
| 2010/0230058 A1 | 9/2010 | Mahoney | |
| 2011/0108207 A1 | 5/2011 | Mainers et al. | |
| 2012/0014060 A1 | 1/2012 | Slessman | |
| 2012/0134110 A1 | 5/2012 | Chang | |
| 2013/0058029 A1 | 3/2013 | Ootani et al. | |
| 2015/0065028 A1* | 3/2015 | Krietzman | H05K 7/20736 454/184 |
| 2015/0334872 A1* | 11/2015 | Cox | H05K 5/0217 454/184 |

OTHER PUBLICATIONS

International Search Report dated Oct. 23, 2015, Int'l Appl. No. PCT/US15/041182, Int'l Filing Date Jul. 20, 2015; 3 pgs.
Written Opinion of the International Searching Authority dated Oct. 23, 2015, Int'l Appl. No. PCT/US15/041182, Int'l Filing Date Jul. 20, 2015; 7 pgs.
International Preliminary Report on Patentability, dated Jan. 24, 2017, Int'l Appl. No. PCT/US15/041182, Int'l Filing Date Jul. 20, 2015; 9 pgs.

* cited by examiner

*Primary Examiner* — Gregory Huson
*Assistant Examiner* — Daniel E Namay

(57) ABSTRACT

A computing rack airflow directing system includes upper and lower rails configured for releasable attachment to a computing rack, and a flexible curtain suspended between the upper and lower rails at upper and lower edges of the curtain, respectively. The curtain is movable along the rails from a retracted position proximate a first end of the rails to provide access to one or more equipment modules mounted in the computing rack to an extended position to form a plenum for directing an airflow between the equipment modules and an airflow port. The airflow port is formed at either the upper edge or the lower edge of the curtain.

20 Claims, 6 Drawing Sheets

COMPUTING RACK AIRFLOW DIRECTING SYSTEM AND METHOD

TECHNICAL FIELD

The disclosure generally relates to computing racks, and more particularly, to a computing rack airflow directing system and method.

BACKGROUND

Computing racks typically comprise a structure in which one or more equipment modules may be mounted. Equipment modules to be placed in the computing rack are typically referred to as rack-mount modules, rack mountable equipment, rack-mount instruments, and the like, and may be any type that is mountable and/or supported in the computing rack. Examples of such equipment include computing devices, blade servers, routers, switches, power supply units, and the like.

The computing rack can have any shape or size. Nevertheless, the shape and size of many currently available structures for supporting equipment modules incorporate 2-post or 4-post designs that have been standardized to be approximately 19 inches wide and include regularly spaced threaded or non-threaded holes for securing the equipment modules to the posts. These computer rack provide for the configuration of a relatively large number of equipment modules in a small volume. Problems arise, however, in that the relatively dense packaging of equipment modules tends to retain heat that must be conveyed away from these computing racks in a simple and cost efficient manner. It is with these issues in mind, among others, that various aspects of the present disclosure were conceived.

SUMMARY

According to one aspect, a computing rack airflow directing system includes upper and lower rails configured for releasable attachment to a computing rack. The airflow directing system also includes a flexible curtain suspended between the upper and lower rails at upper and lower edges of the curtain, respectively. The curtain is movable along the rails from a retracted position proximate a first end of the rails to provide access to one or more equipment modules mounted in the computing rack to an extended position that forms a plenum for directing an airflow between the equipment modules and an airflow port. The airflow port is formed at either the upper edge or the lower edge of the curtain.

BRIEF DESCRIPTION OF DRAWINGS

The foregoing and other objects, features and advantages of the disclosure will be apparent from the following description of particular embodiments of the disclosure, as illustrated in the accompanying drawings in which like reference characters refer to the same parts throughout the different views. The drawings are not necessarily to scale, emphasis instead being placed upon illustrating the principles of the disclosure.

DETAILED DESCRIPTION

Figure 1A:
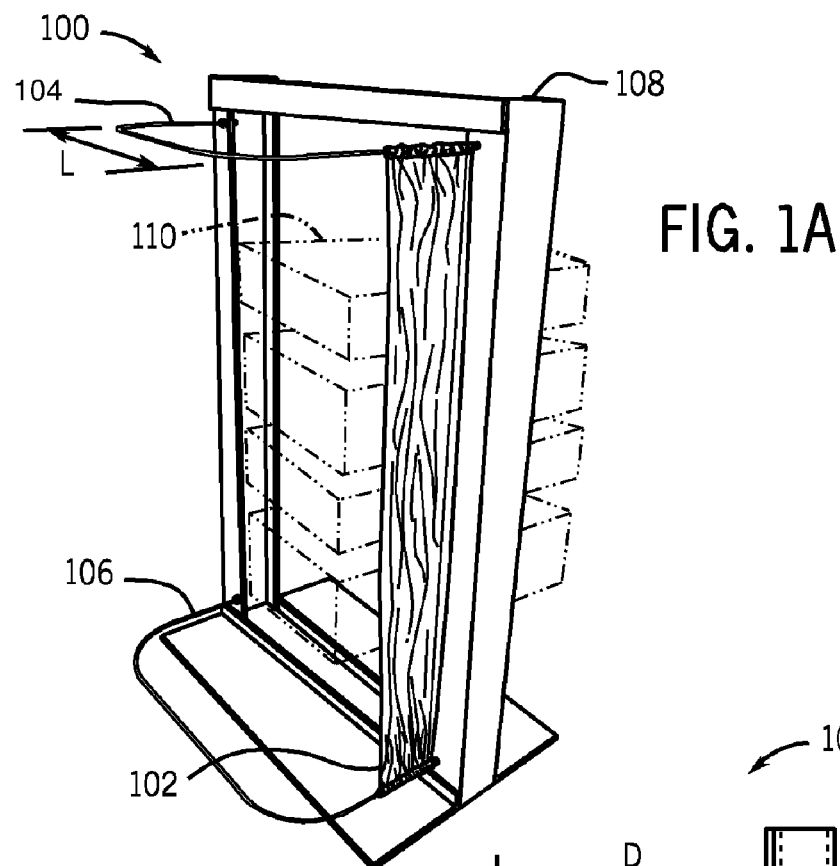
FIGS. 1A and 1B depict a perspective view and a side view, respectively, of an example airflow detecting system configured on a computing rack with its curtain arranged in a retracted position according to the teachings of the present disclosure.
Figure 1B:
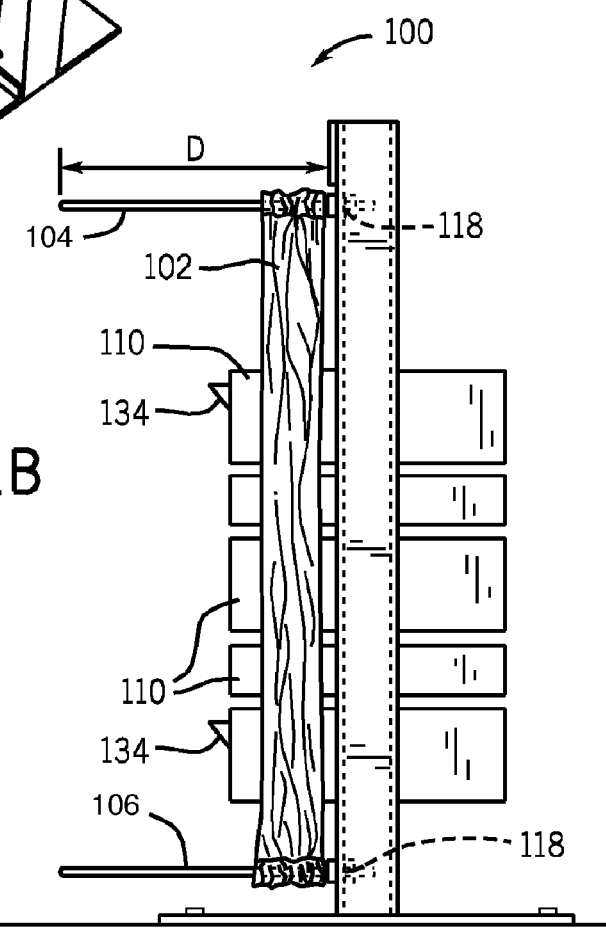

Aspects of the present disclosure provide an airflow directing system that directs exhaust airflow generated by equipment modules configured in a computing rack away from the computing rack. Embodiments disclosed herein include a retractable curtain that is suspended from an upper rail, between upper and lower rails, or otherwise provided, in which the curtain may be retracted to allow access to the equipment modules, and extended to form a plenum for movement of exhaust airflow away from the computing rack in a consistent and undisturbed manner. Additionally, the rails may include telescoping and/or modular components for adjusting its size to accommodate virtually any sized computing rack and/or any number of computing racks. Moreover, in one possible implementation, the curtain is formed form a flexible radient barrier (insulating) material that not only allows the curtain to direct heat up and into hot air returns above the racked computing equipment, it also forms a radient barrier reducing the possibility of the curtain becoming a radient heat emmission source.

FIGS. 1A through 3 illustrates an example airflow directing system 100 according to the teachings of the present disclosure. The system 100 includes a curtain 102 suspended between an upper rail 104 and a lower rail 106. The upper rail 104 and lower rail 106 are releasably attached to a computing rack 108, which in this particular embodiment, is a 2-post computing rack. Nevertheless, other embodiments contemplate that the airflow directing system 100 may be configured on any type of computing rack, such as a 4-post computing rack. Moreover, while illustrated as being suspended between and upper and lower rail, implementations may also be suspended from an upper rail.

The computing rack 108 includes one or more equipment modules 110 that are mounted thereon using screws inserted in regularly spaced threaded holes formed in the computing rack 108. The equipment modules 110 may be any type that is mountable and/or supported in the computing rack 108. Examples of such equipment include stand-alone or rack mount computing devices, blade servers, routers, switches, power supply units, and the like. Collectively, the equipment modules 110 may form a computing system, such as a web server, computer cluster, or communication switch, that provides one or more useful functions.

The computing rack 108 provides for relatively dense mounting of multiple equipment modules 110 that uses a limited amount of space. In many cases, most or all of the equipment modules 110 generate heat that should be dissipated for proper operation. While some equipment modules 110 utilize passive cooling (e.g., cooling fins) to dissipate heat, many other equipment modules 110 employ one or more fans to forcibly move air through its housing that is subsequently exhausted through an exhaust port configured on its outer housing. In many instances, fans pull air into the equipment, and exhaust the air from a back of the equipment.

In many cases, the relatively dense configuration provided by the computing rack leads to cooling problems caused by the multiple equipment modules 110 configured in relatively close proximity to one another. Moreover, in many conventional data centers or other computing rooms, racks are positioned in alternating hot and cold air aisles. Generally speaking, cool air is forced into the cool air aisles through vented floor tiles and then pulled into the cool air intake side of the equipment facing the cool air aisle. The hot air from equipment is exhausted into the hot air aisles. In a conventional arrangement, hot air may be exhausted into the aisle and toward equipment on the other side of the aisle. In data center environments and computer rooms, cooling units are positioned to force cool air under raised flooring so that it blows up into the cool air aisles. Similarly, the cooling units typically draw warm air into the top of the units. Warm air naturally rises up above the racks and equipment and is pulled toward the cooling units.

Embodiments of the present disclosure provide one or more advantages not heretofore realized by conventional computing rack designs by incorporating a curtain 102 that forms a plenum 114 for directing the exhaust airflow emanated by one or more of the equipment modules 110 upwards and away from the computing rack 108. For example, one advantage may include inhibiting the heated exhaust airflow from adversely affecting other computing racks positioned nearby to ensure that the exhaust airflow is not directed towards the inlets of equipment modules 110 configured in these other computing racks. Another advantage is that the hot exhaust air is directed upward and into the hot air return more efficiently then if allowed to merely rise up naturally. As another example, the airflow directing system 100 reduces or inhibits surrounding ambient airflows and exhaust airflows from adversely affected the equipment modules 110 configured in the computing rack 108 that may be moving in alternate directions from the intended airflow from an equipment module 110 and thus would otherwise reduce the airflow rate through that equipment module 110 causing reduced cooling efficiency. Moreover, the curtain may be formed of a reflective insulation to further optimize the performance of the modular curtain arrangement whether deployed for cool air intake or hot air exhaust and directing.

Each of the upper rail 104 and lower rail 106 generally include U-shaped structures with two ends 118 that are releasably secured to the computing rack 108. The ends 118 of the rails 104 and 106 may be secured to the computing rack 108 in any suitable manner. In one embodiment, the ends 118 of each U-shaped structure is configured with a threaded portion 120 that may be inserted through a hole configured in the computing rack 108 and secured in place using a nut 122 and washer portion 124 molded on the U-shaped structure. (See FIG. 3). In one embodiment, the threaded portion 120 is sized for placement through existing holes formed in the computing rack 108.

The rails 104 and 106 with their associated washer portions 124, and threaded portions 120 may be formed of any material sufficiently strong to support the curtain during normal use. Examples of such materials may include carbon steel, stainless steel, aluminum, plastic, fiberglass, and the like. In one embodiment, the U-shaped structure includes a telescoping structure that provides for adjustment of the rails 104 and 106 along a lateral extent L and/or a depth D of the plenum 114 formed by the curtain 102. The telescoping rail allows the curtain to be adjusted to different width equipment, and to equipment that extends different distances from the rack. Moreover, with a telescoping rail, or other rail structures, it is possible to extend the curtain to form a plenum for the equipment in more than one rack. Stated differently, a single curtain assembly may direct exhaust air for the equipment in more than one rack.

Figure 2A:
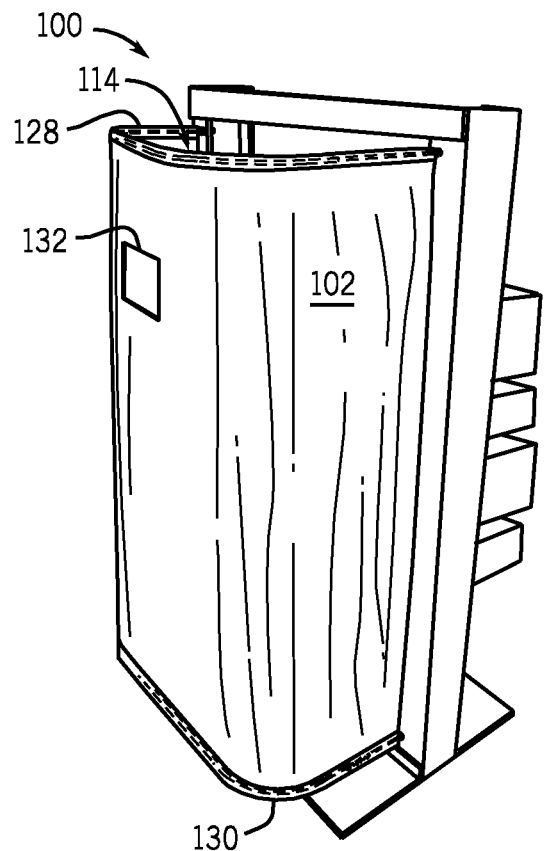
FIGS. 2A and 2B depict a perspective view and a side view, respectively, of the example airflow detecting system of FIGS. 1A and 1B configured on a computing rack with its curtain arranged in an extended position according to the teachings of the present disclosure.
Figure 2B:
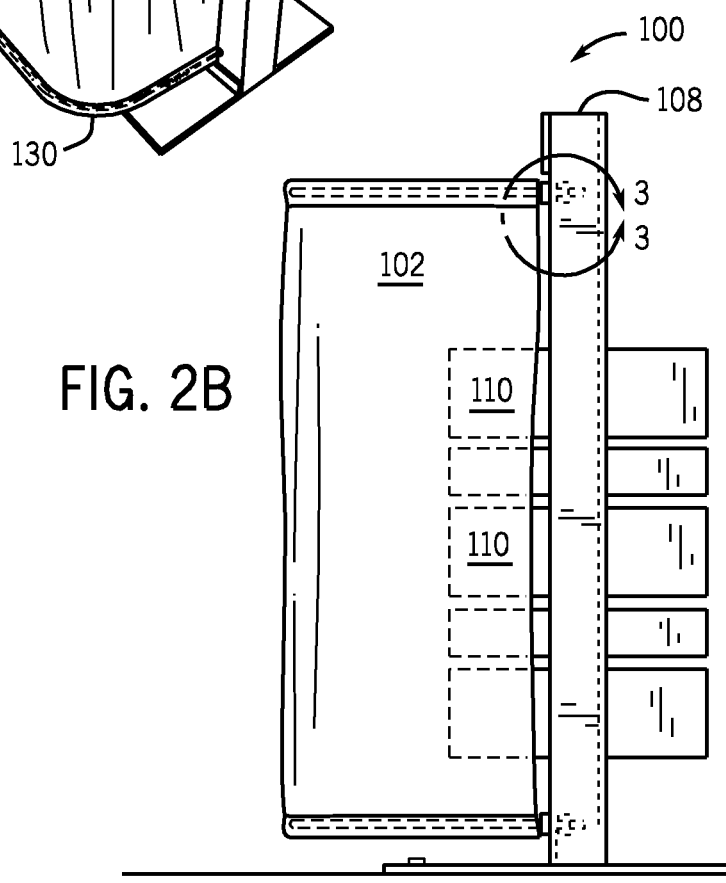
Figure 3:
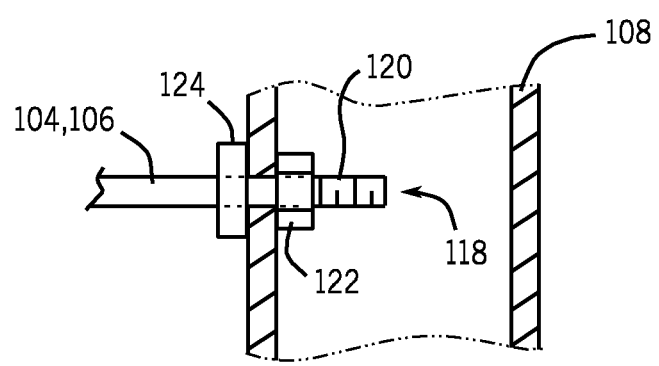
FIG. 3 depicts a partial, enlarged side view taken along the lines of FIG. 2B showing the releasable attachment of the ends of the rails to the computing rack according to the teachings of the present disclosure.
Figure 4A:
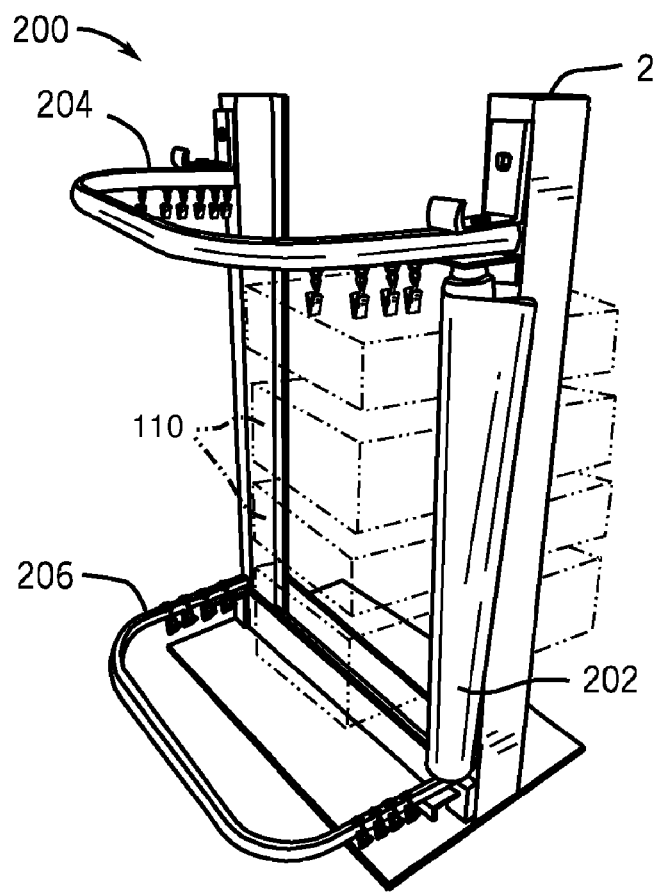
FIGS. 4A and 4B depict a perspective view and a side view, respectively, of another example airflow detecting system configured on a computing rack with its curtain arranged in a retracted position according to the teachings of the present disclosure.
Figure 4B:
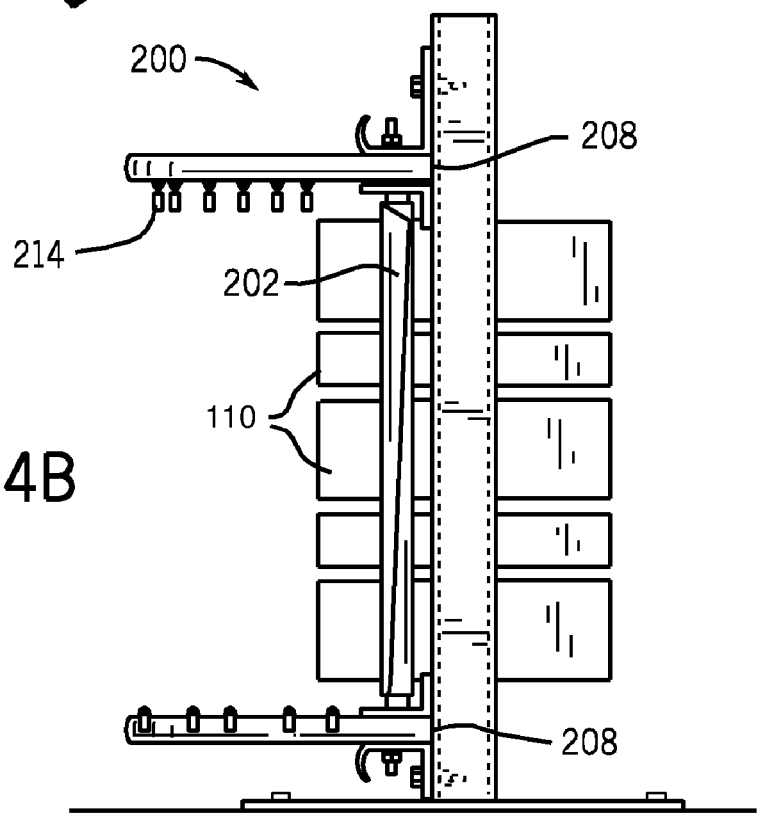
Figure 5A:
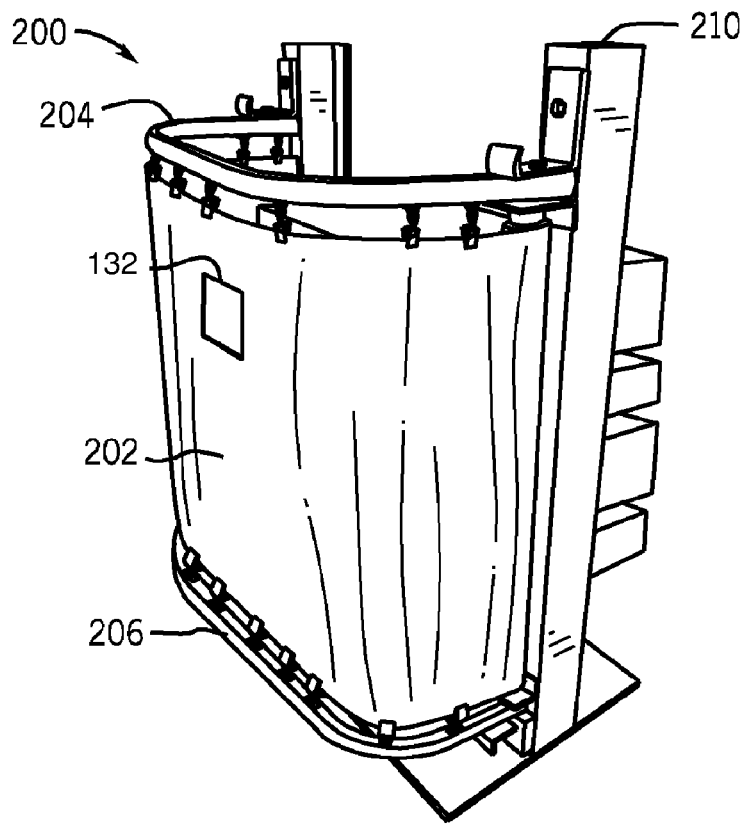
FIGS. 5A and 5B depict a perspective view and a side view, respectively, of the example airflow detecting system of FIGS. 4A and 4B configured on a computing rack with its curtain arranged in an extended position according to the teachings of the present disclosure.
Figure 5B:
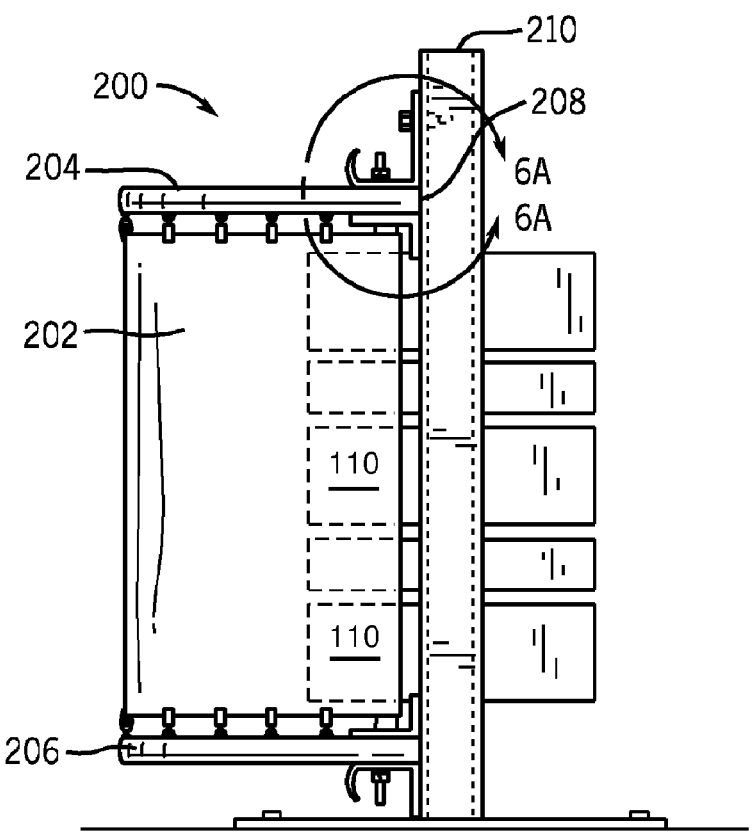

The curtain 102 includes an upper edge 128 and a lower edge 130 that may be secured to the upper rail 104 and lower rail 106, respectively. The curtain 102 may be secured to the rails 104 and 106 in any suitable manner that allows it to be moved or slid from a retracted position proximate one end of the rails 104 and 106 (FIGS. 1A and 1B) to an extended position (FIGS. 2A and 2B). For example, the curtain may have a channel sewn or otherwise formed in the top edge and the bottom edge of the curtain whereby the rail fits within the channel and the curtain may be moved between an open (retracted) position (to access equipment) and closed (extended) position (plenum forming). As shown, when the curtain 102 is in the retracted position, access may be provided to the equipment modules 110 configured in the computing rack 108. When in the extended position, the curtain forms a plenum 114 for directing an exhaust airflow from the equipment modules to an exhaust airflow port, which in this particular embodiment is formed by an upper edge 128 of the curtain 102. In another embodiment, the curtain 102 forms a plenum that directs an exhaust airflow from the equipment modules 110 to an exhaust airflow port formed by the lower edge 130 of the curtain 102. In other embodiments, the curtain 102 forms a plenum for directing an inlet airflow from an inlet airflow port formed by either the upper edge 128 or lower edge 130 of the curtain 102 and into the equipment modules 110. For example, the curtain 102 as shown may be configured to direct an exhaust airflow from the equipment modules 110 to an exhaust airflow port formed by the upper edge 128 of the curtain, while another airflow directing system (not shown) configured on the opposing side of the computing rack 108 is configured to direct an inlet airflow from the lower edge of its respective curtain to the equipment modules 110 configured in the computing rack 108.

The curtain 102 may be formed of any flexible material that is sufficiently robust to direct exhaust or inlet airflows from the computing rack 108 under normal operating conditions. In one embodiment, the curtain 102 is formed of a fireproof material. In another embodiment, the curtain 102 includes an outer radiant barrier layer, such as one made from Silvertanium™, that thermally insulates the airflow in the plenum formed by the curtain 102 from the ambient environment.

In one embodiment, the curtain 102 includes a window 132 for providing visual access to the equipment modules 110 when the curtain 102 is in the extended position. The window 132 is formed from a planar sheet of transparent material having an outer periphery that is attached to an inner periphery of a hole configured in the curtain 102. Like the material from which the curtain 102 is formed, the window 132 may be made of a fireproof material, such as LEXAN™ or other similar material, depending on the requirements of whatever environment the curtain is being deployed.

In one embodiment, air deflectors 134 may be implemented on one or more equipment modules 110 for directing exhaust airflows from their respective equipment modules 110 in a direction toward the exhaust port of the system. By implementing the air deflectors, certain embodiments may provide an advantage of reduced turbulence caused within the plenum formed by the curtain 102 due to exhaust airflows from the equipment modules 110, which are often laterally oriented and thus contrary to the main airflow through the plenum, which may be either upwards or downwards. The deflected air may also assist in creating an upward airflow within the plenum to assist in carrying the exhaust air up into the return above the equipment.

The air deflector 134 is formed from a single sheet of material (e.g., sheet metal) that is bent to form a vane coupled to flanges on either end. When mounted onto an equipment module 110, the vane is oriented at a specified angle (e.g., 45 degrees) such that a laterally oriented exhaust airflow from its respective equipment module 110 is directed either upwards or downwards.

Although the embodiment above describes one particular example of a computing rack airflow directing system, other embodiments may be employed without departing from the spirit and scope of the present disclosure. For example, other embodiments may employ only one rail in which the curtain 102 hangs in pendant fashion from a single upper rail, or more than two rails, such as a third rail that is configured in between the upper rail 104 and lower rail 106 on the computing rack 108. As another example, the lateral extend L of the upper and lower rails 104 and 106 may be adjusted to encompass two or more computing racks 108 that are arranged adjacent to one another such that a single plenum may be formed around two or more computing racks 108 for moving the heated airflow away from the computing racks 108.

FIGS. 4A through 6B illustrate another embodiment of the airflow directing system 200 according to the teachings of the present disclosure. The airflow directing system 200 includes a curtain 202 that is similar in design and purpose to the curtain 102 of FIGS. 1A through 3. The airflow directing system 200 also includes an upper rail 204 and a lower rail 206 comprising U-shaped structures with two ends 208 that are releasably secured to an computer rack 210 and suspend the curtain at upper and lower ends thereof. The upper and lower rails 204 and 206 differ, however, in that spring-loaded clips 214 are provided for releasable securement of the upper and lower edges of the curtain 202 to the upper and lower rails, respectively.

Although spring-loaded clips 214 are described in the present example, any suitable type of releasable securement mechanism may be used, such as hook-and-loop fasteners, multiple magnets embedded in the curtain that adhere to magnetically attractive material (e.g., ferrous metals) formed in the rails, multiple holes formed in the curtain at regular intervals for insertion over a corresponding number of posts formed in the upper and lower rails. Hooks may also be slidably positioned on the rails, the curtain hanging from the hooks.

The upper and lower rails 204 and 206 each include two ends 208 that are mounted to the computing rack 210 using a bracket 216 at each end 208. (See FIG. 6A). As shown, the bracket 216 is mounted to the computing rack 210 with a first bolt 218, and to the rail 204 or 206 using the second bolt 220. In one embodiment, the first bolt 218 is sized to be inserted through an existing hole in the computing rack 210. In this manner, the rails 204 and 206 may be easily mounted onto the computing rack 210 and moved to different positions on the computing rack 210 as the need arises in certain embodiments.

In one embodiment, the upper and lower rails 204 and 206 may be provided as modular sections. In this manner, the rails 204 and 206 may be packaged in a smaller volume for ease of storage, shipment and carrying into a center for assembly. Additionally, modular sections of the rails may be added to the rails 204 and 206 for adjusting its lateral extent across the computing rack 210 and the depth of the plenum formed by the curtain 202 when in the extended position.

Figure 6A:
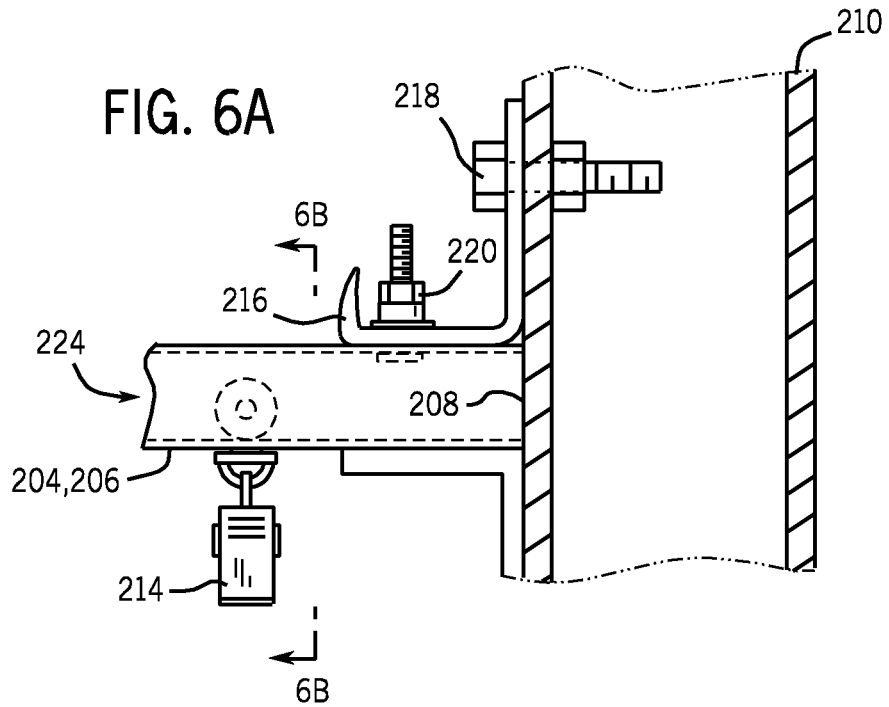
FIG. 6A depicts a partial, enlarged side view taken along the lines of FIG. 5B showing the releasable attachment of the ends of the rails of FIGS. 4A and 4B to the computing rack according to the teachings of the present disclosure.
Figure 6B:
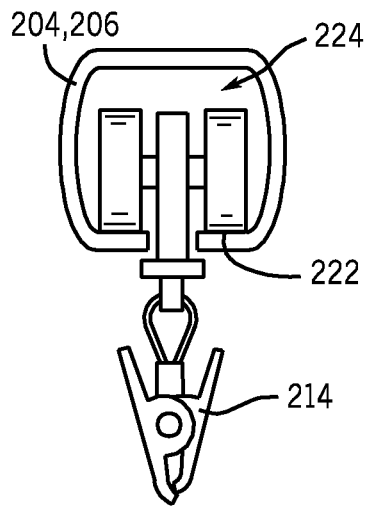
FIG. 6B depicts a partial, enlarged side view taken along the lines of FIG. 6A showing the arrangement of the roller bearings and associated channel formed in the rails of FIGS. 4A and 4B according to the teachings of the present disclosure.

FIG. 6B illustrates an enlarged, cross-sectional view of the rail taken along the lines of FIG. 6A showing the arrangement of the spring-loaded clips 214 on the rails 204 and 206. As shown, each clip 214 is physically coupled to a roller bearing 222 that rides along a channel 224 formed in the rail 204 and 206. The roller bearing 222 provides for ease of movement of the curtain 202 from the retracted position (FIGS. 4A and 4B) to the extended position (FIGS. 5A and 5B) by reducing friction that would otherwise be caused by direct contact of the curtain 202 with the rails 204 and 206.

To use, the upper and lower rails 104 and 106 of the embodiment of FIGS. 1A through 3 or the upper and lower rails 204 and 206 of the embodiment of FIGS. 4A through 6B is mounted on a computing rack. In a particular embodiment, the upper and lower rails may be mounted on the computing rack to be spaced apart at a specified elevation distance such that, when the curtain is suspended therebetween, undue sagging of the curtain and/or excess physical stretching of the curtain is reduced or eliminated. In one embodiment, the size of the upper and lower rails may be adjusted using a telescoping action or by adding or removing modular sections from the upper and lower rails to accommodate the lateral expanse of the computing rack 108 or 210 and/or to adjust a depth of a plenum to be formed by the curtain 102 or 202 when moved to the extended position. The curtain 102 or 202 is then suspended between the upper and lower rails.

During operation of the computing rack 108 or 210, the curtain may be maintained in the extended position to form a plenum for moving the heated airflow away from the computing rack 210, and retracted to provide access to the equipment modules configured in the computing rack 108 or 210. In one embodiment, the computing rack 108 or 210 and mounted airflow directing system 100 or 200 may be positioned such that the plenum formed by the curtain is directly over a cold air vent configured in a floor that supports the computing rack 108 or 210. In another embodiment, air deflectors 134 may be configured on one or more equipment modules 110 to divert airflows generated by the equipment modules 110 toward a direction similar to that of the airflow through the plenum formed by the curtain 102 or 202.

Use of the system 100 or 200 may be embodied in other specific forms without deviating from the spirit and scope of the present disclosure. For example, the lateral extend L of the upper and lower rails 104 and 106 may be adjusted to encompass two or more computing racks 108 that are arranged adjacent to one another such that a single plenum may be formed around two or more computing racks 108 for moving the heated airflow away from the computing racks 108. As another example, the system 100 or 200 may be arranged to form a plenum that moves an airflow, such as an inlet airflow, in a downward direction rather than an upward direction for introducing cool inlet air to the equipment modules 110 configured in the computing rack 108 or 210.

Although the present disclosure has been described with reference to various embodiments, it will be understood that the disclosure is not limited to the details thereof. Various modifications and substitutions will occur to those of ordinary skill in the art. All such substitutions are intended to be embraced within the scope of the disclosure as defined in the appended claims.

What is claimed is:

1. A computing rack airflow directing system comprising:
    upper and lower rails configured for releasable attachment to a computing rack; and
    a flexible curtain suspended between the upper and lower rails at upper and lower edges of the curtain, respectively, the curtain being movable along the rails from a retracted position to an extended position,
    wherein the curtain is contracted proximate a first end of the rails to provide access to one or more equipment modules mounted in the computing rack when in the contracted position, and
    wherein the curtain forms a plenum for directing an airflow between the equipment modules and an airflow port when in the extended position, the airflow port formed at either the upper edge or the lower edge of the curtain.

2. The computing rack airflow directing system of claim 1, wherein the airflow comprises an exhaust airflow out of at least one of the equipment modules, and wherein the airflow port is formed at the upper edge of the curtain when in the extended position.

3. The computing rack airflow directing system of claim 1, further comprising an air deflector mounted on an air outlet port of at least one equipment module, the air deflector configured to divert the airflow from the air outlet port toward the outlet port of the curtain.

4. The computing rack airflow directing system of claim 3, wherein the fireproof material comprises aluminum.

5. The computing rack airflow directing system of claim 4, wherein the radiant barrier comprises a silvertanium material.

6. The computing rack airflow directing system of claim 1, wherein the curtain is formed of a fireproof material.

7. The computing rack airflow directing system of claim 1, wherein the curtain comprises a radiant barrier layer.

8. The computing rack airflow directing system of claim 1, further comprising at least one piece of flexible transparent material having an outer periphery that is attached to an inner periphery of a hole configured in the curtain, the transparent material forming a window for viewing the equipment modules when the curtain is in the extended position.

9. The computing rack airflow directing system of claim 1, wherein the curtain is selectively removable from the upper and lower rails using at least one of a plurality of spring loaded clips, hook-and-loop fasteners, a plurality of magnets, and a plurality of holes configured in the curtain configured for insertion over a corresponding plurality of posts configured on the rails.

10. The computing rack airflow directing system of claim 1, wherein the upper and lower rails each comprise telescoping rails for adjusting at least one of a lateral expanse of the rails and a depth of the plenum formed by the curtain when in the extended position.

11. The computing rack airflow directing system of claim 1, wherein the upper and lower rails each comprise modular rail sections for adjusting at least one of a lateral expanse of the rails and a depth of the plenum formed by the curtain when in the extended position.

12. Two computing rack airflow directing systems of claim 1, wherein
    a first of the two computing rack airflow directing systems is configured for releasable attachment to a first side of the computing rack, the airflow port of the first computing rack airflow directing system comprising the lower edge of the curtain and forming an inlet airflow port for placement proximate a vented air tile of a cool air aisle, and
    wherein a second of the two computing rack airflow directing systems is configured for releasable attachment to a second side of the computing rack, the airflow port of the second computing rack airflow directing system comprising the upper edge of the curtain and forming an outlet airflow port for placement proximate a hot air aisle.

13. A method comprising:
    providing an upper rail, a lower rail, and a flexible curtain;
    removably attaching the upper and lower rails to a computing rack;
    suspending the flexible curtain between the upper and lower rails at upper and lower edges of the curtain;
    moving the curtain to a retracted position proximate a first end of the rails to provide access to one or more equipment modules mounted in the computing rack; and
    moving the curtain to an extended position along the upper and lower rails such that the curtain forms a plenum for directing an airflow between the equipment modules and an airflow port, the airflow port formed at either the upper edge or the lower edge of the curtain.

14. The method of claim 13, wherein removably attaching the upper and lower rails to the computing rack comprises telescoping at least one of a lateral expanse of the rails to accommodate a lateral expanse of the computing rack and a depth of the plenum formed by the curtain when in the extended position.

15. The method of claim 13, wherein removably attaching the upper and lower rails to the computing rack comprises assembling multiple modular sections of the upper and lower rails to form at least one of a lateral expanse of the rails to accommodate a lateral expanse of the computing rack and a depth of the plenum formed by the curtain when in the extended position.

16. The method of claim 13, further comprising placing a lower port of the curtain over a cold air tile configured in a floor on which the computing rack is supported, the lower port formed by the lower edge of the curtain.

17. The method of claim 13, further comprising mounting an air deflector on an air outlet port of at least one equipment module, the air deflector diverting the airflow from the air outlet port toward the outlet port of the curtain.

18. An airflow directing system comprising:
    a computer rack comprising a computing rack on which one or more equipment modules are mounted;
    upper and lower rails configured for releasable attachment to the computing rack; and
    a flexible curtain suspended between the upper and lower rails at upper and lower edges of the curtain, respectively, the curtain being movable along the rails from a retracted position to an extended position, wherein the curtain is contracted proximate a first end of the rails to provide access to the equipment modules mounted in the computing rack when in the contracted position, and wherein the curtain forms a plenum for directing an airflow between the equipment modules and an airflow port when in the extended position, the airflow port formed at either the upper edge or the lower edge of the curtain.

19. The directing system of claim 18, wherein the airflow comprises an exhaust airflow out of at least one of the equipment modules, and wherein the airflow port is formed at the upper edge of the curtain when in the extended position.

20. The computing rack airflow directing system of claim 18, further comprising at least one piece of flexible transparent material having an outer periphery that is attached to an inner periphery of a hole configured in the curtain, the transparent material forming a window for viewing the equipment modules when the curtain is in the extended position.

\* \* \* \* \*